United States Patent [19]

Matsumoto et al.

[11] Patent Number: 4,857,981
[45] Date of Patent: Aug. 15, 1989

[54] SEMICONDUCTOR IMAGING DEVICE

[75] Inventors: Kazuya Matsumoto; Tsutomu Nakamura, both of Ina, Japan

[73] Assignee: Olympus Optical Co., Ltd., Tokyo, Japan

[21] Appl. No.: 60,545

[22] Filed: Jun. 11, 1987

[30] Foreign Application Priority Data

Jul. 3, 1986 [JP] Japan .................. 61-156399

[51] Int. Cl.4 .................. H01L 27/14; H01L 29/78; H01L 17/10
[52] U.S. Cl. .................. 357/30; 357/24; 357/32; 357/41; 357/45; 357/47; 357/49; 357/23.1; 357/23.11
[58] Field of Search .............. 357/30 G, 30 H, 30 I, 357/30 Q, 24 LR, 41, 45, 32, 24, 47, 49, 30 R, 23.1, 23.11

[56] References Cited

U.S. PATENT DOCUMENTS

| | | | |
|---|---|---|---|
| 4,300,151 | 11/1981 | Nishizawa | 357/24 LR |
| 4,364,167 | 12/1982 | Donley | 357/45 |
| 4,377,817 | 3/1983 | Nishizawa et al. | 357/30 I |
| 4,570,176 | 2/1986 | Kolwicz | 357/45 |
| 4,571,624 | 2/1986 | Nishizawa et al. | 357/24 LR |
| 4,589,027 | 5/1986 | Nakamura | 358/213 |
| 4,616,249 | 10/1986 | Nishizawa et al. | 357/30 I |
| 4,677,453 | 6/1987 | Matsumoto et al. | 357/30 |
| 4,684,992 | 8/1987 | Nakamura et al. | 358/213.12 |
| 4,686,555 | 8/1987 | Yusa et al. | 357/30 I |
| 4,700,231 | 10/1987 | Matsumoto | 358/213.12 |

FOREIGN PATENT DOCUMENTS

| | | | |
|---|---|---|---|
| 55-15229 | 2/1980 | Japan | . |
| 60-140752 | 7/1985 | Japan | . |
| 60-206063 | 10/1985 | Japan | . |
| 61-12063 | 1/1986 | Japan | 357/30 I |

OTHER PUBLICATIONS

"A New MOS Phototransistor Operating in a Non-Destructive Readout Mode", Mitsumoto et al., Japanese Journal of Applied Physics, vol. 24, No. 5, May 1985, pp. L323-L325.

Primary Examiner—Andrew J. James
Assistant Examiner—Ngan Van Ngo
Attorney, Agent, or Firm—Armstrong, Nikaido, Marmelstein, Kubovcik & Murray

[57] ABSTRACT

A semiconductor imaging device includes lateral MOS static induction transistors including: a semiconductor layer formed on an insulating substrate or a high-resistance semiconductor substrate; and picture elements arranged in the form of a matrix over the surface of the semiconductor layer, the picture elements respectively constituted by lateral MOS static induction transistors each having a source region and a drain region both of which serve as main electrodes and a gate region for storing therein a photoelectric signal. Isolating regions are formed between the respective picture elements vertically or laterally on the matrix so that the picture elements which are adjacent to each other vertically or laterally share their source and drain regions with each other. Accordingly, each of the gate regions constitutes in combination with the adjacent source or drain region an equivalent unit picture element, thereby improving the density of picture-element formation.

4 Claims, 7 Drawing Sheets

F I G. 3
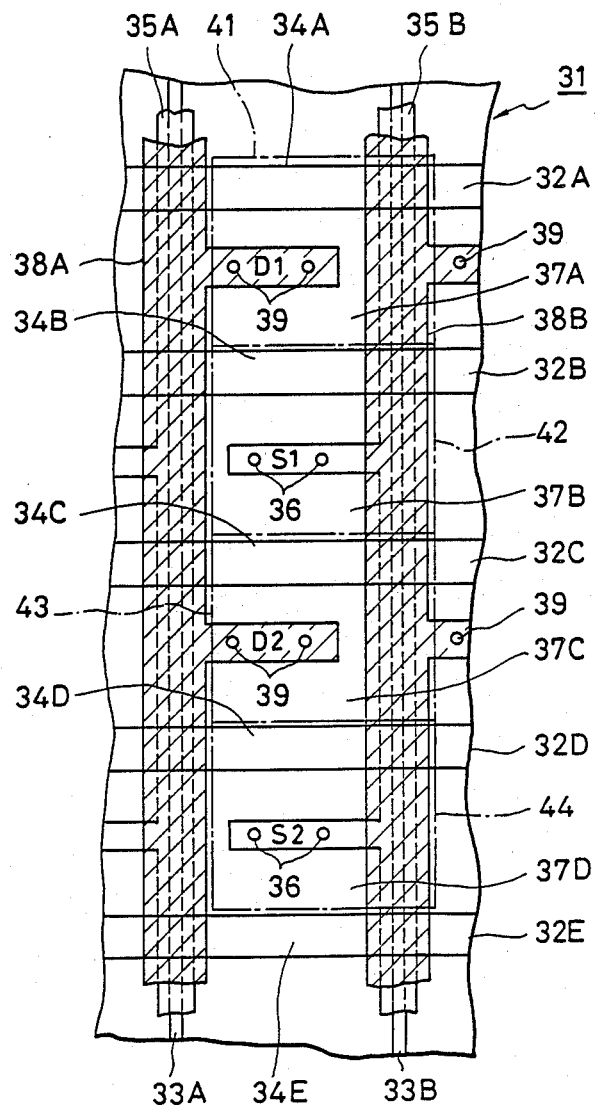

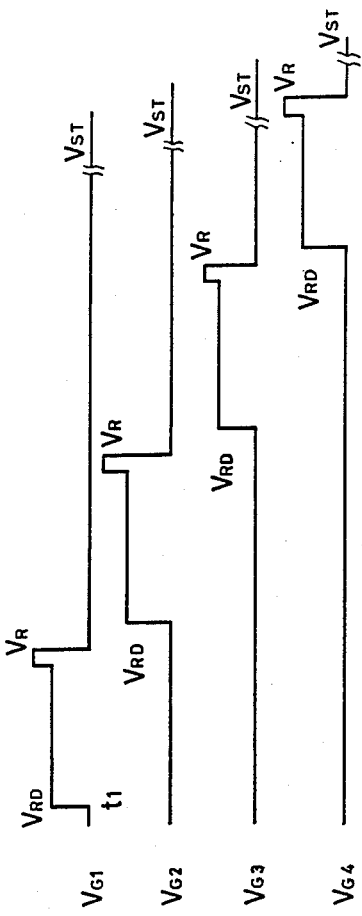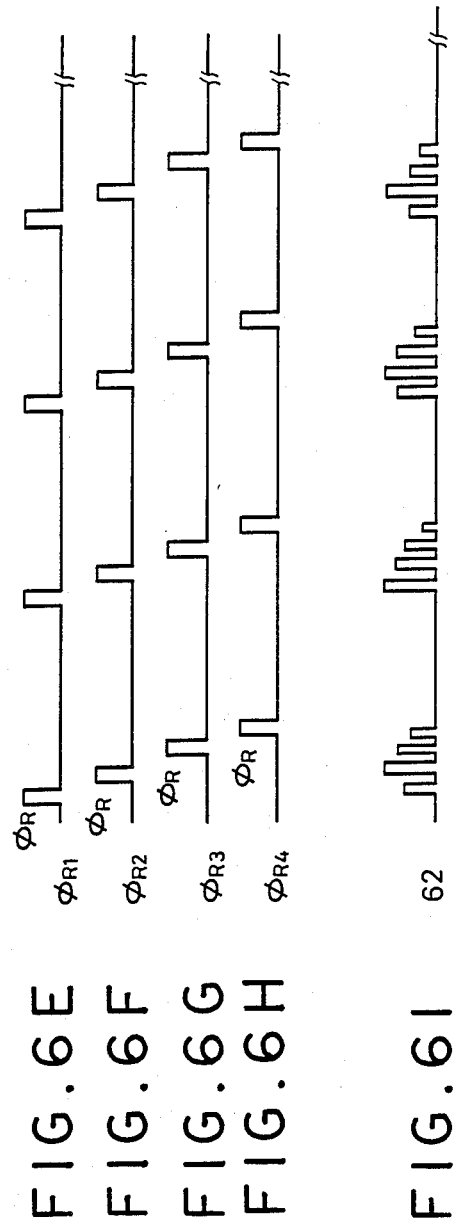

SEMICONDUCTOR IMAGING DEVICE

BACKGROUND OF THE INVENTION

1. Field of the Invention

The present invention relates to a semiconductor imaging device employing lateral MOS static induction transistors.

2. Description of the Prior Art

Charge transfer devices such as BBDs and CCDs, MOS transistors and the like have heretofore been widely used as a semiconductor imaging device of the type constituted by a semiconductor photoelectric conversion device, the semiconductor imaging device being typically incorporated in an electronic camera, a home video camera, a facsimile system or the like. However, a typical semiconductor imaging device using such devices involves various problems in that the leakage of electric charge may take place while a signal electric charge is being transferred, in that its photoelectric sensitivity is inferior, and in that the degree of circuit integration is low.

In order to solve the problems, proposals have heretofore been made with respect to use of a semiconductor imaging device of the type employing static induction transistors (hereinafter referred to simply as "SIT" or "SITs"). The SIT is a kind of phototransistor which has the function of photoelectric conversion and the function of amplifying photoelectric charge. As compared with field effect transistors and junction transistors, the SIT possesses various advantages such as high input impedance, high-speed operation, non-saturability, low noise and low power consumption.

Accordingly, if the SIT is utilized as a photosensitive element, it is possible to obtain a semiconductor imaging device having high photoelectric sensitivity, high-speed response and a wide dynamic range.

It is known that so-called vertical junction SITs, lateral MOS SITs or the like are used in such a semiconductor imaging device employing SITs. A semiconductor imaging device employing vertical junction SITs is disclosed in the specification of Japanese Pat. Laid-open No. 15229/1980.

FIG. 1 diagrammatically shows the sectional structure of one of the SITs which respectively constitute the picture elements of the known semiconductor imaging device. As shown, the SIT has a vertical structure in which an n+-type substrate 1 serves as a drain region, an n−-type epitaxial layer 2 which constitutes a channel region being deposited upon the substrate 1 and a source region 3 constituted by an n+-type region being formed in the surface of the epitaxial layer 2. Moreover, a signal storage gate region 4 of a p+type is formed in the surface of the epitaxial layer 2 such that the region 4 surrounds the source region 3. An electrode 6 is formed on the gate region 4 with an insulating film 5 being interposed therebetween, and this constitutes a so-called MIS (metal insulator semiconductor) structure which typically includes an electrode, an insulating film and a gate region. Incidentally, isolating regions 7 are so formed as to separate the respective SITs which constitute picture elements.

However, in each of the SITs having the above-described vertical structure, it is necessary to increase the thicknesses of the epitaxial layer 2 and the gate region 4 in order to enhance an amplification factor with respect to incident light. In addition, it is also necessary to separate the respective signal electric charges produced in the SITs by disposing the isolating regions 7 between the respective SITs of the semiconductor imaging device which is constructed in the aforesaid manner. In order to enable this separation, it is a common practice to use several known methods such as separation based on the use of oxide film, separation obtained by diffusion, separation based on the use of V-shaped trenches and the like. In this case, the isolating regions 7 are formed such as to extend from the surface of the epitaxial layer 2 to the substrate 1. Therefore, if the thickness of the epitaxial layer 2 is increased in order to enhance the amplification factor with respect to incident light, this makes it more difficult to form the isolating regions 7. Diffusion or similar method have limitations when the gate region 4 is to be deeply formed for the purpose of enhancing the amplification factor. If the gate region 4 is deepened, photoabsorption may take place in the gate region 4 and this could result in a lowering of photosensitivity. For these reasons, the semiconductor imaging device including the SITs having the vertical structure involves a limitation when the amplification factor or the photosensitivity is to be improved. This disadvantage cannot possibly be avoided in terms of the structure of such a device in itself.

In order to solve the aforesaid disadvantage, the present applicant previously disclosed a semiconductor imaging device including lateral MOSSITs in the specifications of Japanese Pat. Laid-open Nos. 140752/1985 and 206063/1985 and a treatise entitled "A New MOS Phototransistor Operating in a Non-Destructive Readout Mode", published in Japanese Journal of Applied Physics, Vol. No. 5, 1985.

The following is a description of the photosensitive elements of a semiconductor imaging device including the lateral MOSSITs each having a prior-art MIS gate structure.

FIGS. 2A and 2B respectively are a top plan view and sectional view of a lateral MOSSIT type photosensitive element which constitute each of the picture elements of a known semiconductor imaging device proposed by the present applicant. The structure, parameters and the like of the lateral MOSSIT photosensitive element of an n-channel type will be described below. In FIGS. 2A and 2B, a p−type ,100. substrate is indicated at 11, and the substrate 11 has a concentration of about $10^{12}$ to $10^{15}$ cm$^{-3}$. An n−-type epitaxial layer 12 is grown on the substrate 11 by an epitaxial method, and constitutes n$^{31}$ type channel regions. The aforesaid n−-type epitaxial layer 12 has a thickness of about 5 to 10 μm and a concentration of about $1 \times 10^{13}$ to $5 \times 10^{13}$ cm$^{-3}$. The n−type epitaxial layer 12 has a surface including an n+-type drain region 13 and an n+-type source region 15, the regions 13 and 15 being respectively made of shallow diffused layers. In this case, the n+-type drain region 13 and the n+-type source region 15 are formed in a self-aligned manner with respect to a gate electrode 17 which will be described later.

The depth of diffusion in the n+-type drain region 13 is equal to or less than about 0.5 μm. A gate insulating film 16 is formed on the n−-type epitaxial layer 12, and has a thickness of about 200 to 1000 °Å. The gate electrode 17 is formed on the gate insulating film 16, and the aforesaid n+-type drain region 13 and n+-type source region 15 are formed in a self-aligned manner with respect to the gate electrode 17. The gate electrode 17 is formed by, for example, a polysilicon film having a thickness of about 5000 Å or less. A drain electrode 18 is formed on the n+-type drain region 13 and a source electrode 19 is formed on the n+-type source region 15. An insulating film is indicated at 20, and an isolating region 21 is formed so as to separate the respective picture elements, the region 21 made of an insulating film being formed by a trench forming method.

The operation of the aforesaid lateral MOSSIT type photosensitive element will be described in brief with reference to FIGS. 2A and 2B. When a minus voltage (not shown) is applied to the gate electrode 17, a signal electric charge is generated in response to incident light 22 which is incident from above the gate electrode 17. The signal electric charge is stored in the surface of the $n^-$-type channel region within the $n^-$-type epitaxial layer 12, which surface is defined directly below the gate electrode 17. The storage of the signal electric charge enables modulation of electron current flowing between the n+-type source region 15 and the n+-type drain region 13 in the $n^-$-type channel region.

However, in a semiconductor imaging device of the type utilizing the above-described lateral MOSSITs, the source and drain regions are formed for each of the picture elements, and, in addition, each group of the source, gate and drain regions is surrounded by the isolating region. This makes it difficult to reduce the size of each of the picture elements.

SUMMARY OF THE INVENTION

It is therefore an object of the present invention to provide a semiconductor imaging device employing lateral MOSSITs in which it is possible to solve the disadvantage of a semiconductor imaging device having the aforesaid prior-art lateral MOSSITs and in which each picture element thereof can be reduced in size.

The present invention provides a semiconductor imaging device including lateral MOS static induction transistors having: a semiconductor layer formed on an insulating substrate or a high-resistance semiconductor substrate; and picture elements arranged in the form of a matrix over the surface of said semiconductor layer, the picture elements respectively constituted by lateral MOS static induction transistors each having a source region and a drain region both of which serve as main electrodes and a gate region for storing therein a photoelectric signal, in which the improvement comprises isolating regions formed between the respective picture elements in one direction only on the matrix so that the respective adjacent picture elements share their source and drain regions with each other in the aforesaid direction.

This arrangement enables equivalent unit picture elements to be constructed by either a combination of the photosensitive gate regions and the source regions or a combination of the photosensitive gate regions and the drain regions. Accordingly, the picture elements can be reduced in size to enhance the density of picture-element formation, so that it is possible to achieve a semiconductor imaging device with high resolution.

BRIEF DESCRIPTION OF THE DRAWINGS

FIG. 3 is a schematic, top plan view of a basic construction of a semiconductor imaging device in accordance with the present invention;

FIGS. 6A to 6I are charts showing the waveforms of signals used for the purpose of causing the operation of the embodiment shown in FIG. 4.

DESCRIPTION OF THE PREFERRED EMBODIMENTS

Figure 1:
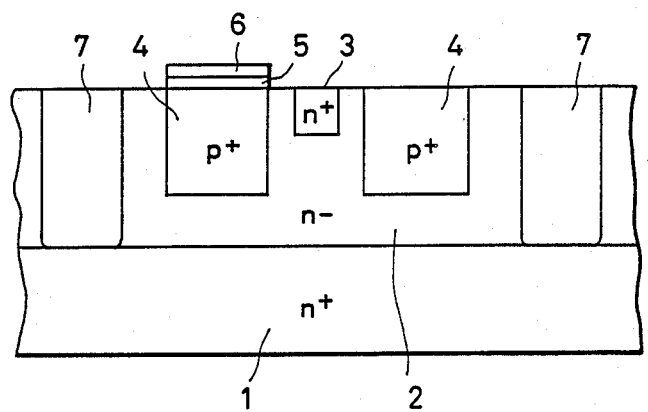
FIG. 1 is a schematic, sectional view of a semiconductor imaging device employing vertical SITs of the prior art.
Figure 2A:
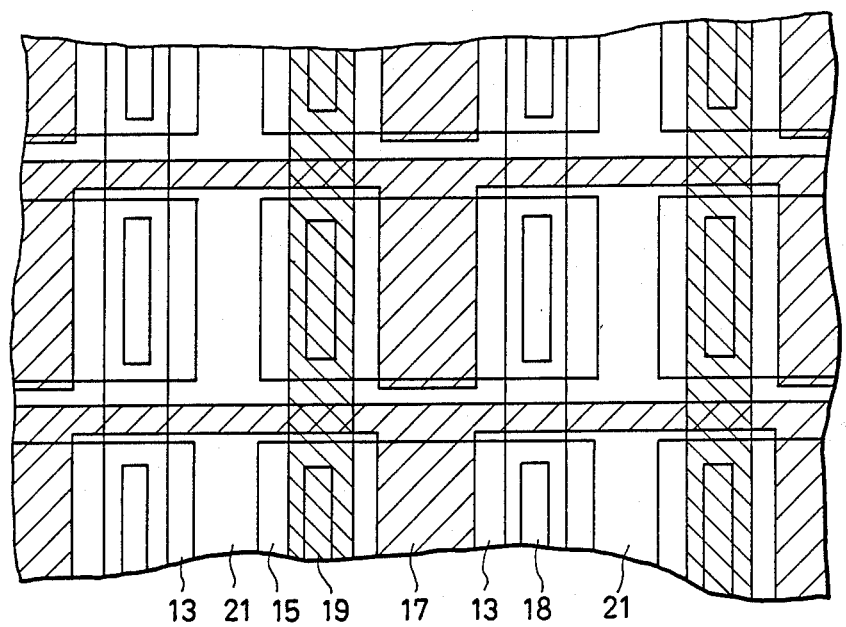
FIGS. 2A and 2B are respectively a top plan view and a sectional view schematically showing a semiconductor imaging device employing lateral SITs which was previously proposed by the present applicant.
Figure 2B:
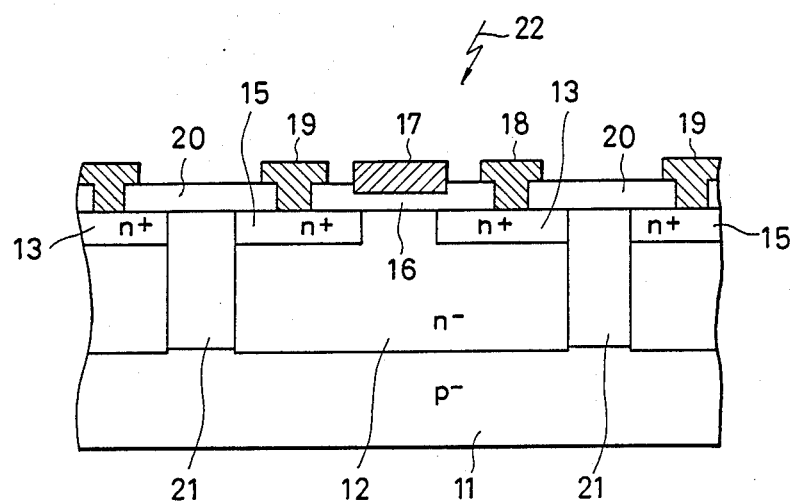

The preferred embodiment of the semiconductor imaging device of the present invention will be described below with reference to the accompanying drawings.

FIG. 3 is a top plan view partially showing of one example of the basic construction of the imaging part of the semiconductor imaging device in accordance with the present invention. In FIG. 3, the imaging part of the semiconductor imaging device of the invention is indicated generally at 31, and gate lines 32A, 32B, 32C, 32D and 32E are connected to a vertical selection circuit (not shown). Isolating layers 33A and 33B separate the picture elements to form picture element arrays in columns on the matrix. A photosensitive gate region is formed beneath each of the gate lines 32A to 32E, and the regions are likewise separated in columns by the isolating layers 33A and 33B. The photosensitive gate regions separated by the isolating layers 33A and 33B are respectively indicated at 34A, 34B, 34C, 34D and 34E. Source/drain diffused layers 37A, 37B, 37C and 37D are formed between the photosensitive gate regions 34A, 34B, 34C, 34D and 34E, respectively. Source lines are indicated at 35A and 35B, and the respective source lines 35A and 35B are connected to sources S1 and S2 via contact holes 36 formed in each electrode portion. The sources S1 and S2 are formed by the source/drain diffused layers 37B and 37D which are alternately disposed. Drain lines are indicated at 38A and 38B, and the respective drain lines 38A and 38B are connected to drains D1 and D2 via contact holes 39 formed in each electrode portion. The drains D1 and D2 are provided in the source/drain diffused layers 37A and 37C which are alternately disposed. The source lines 35A, 35B and the drain lines 38A, 38B are respectively connected to a horizontal selection circuit and a drain voltage supply (neither of which is shown).

In this arrangement, since no insulating layer is laterally formed, the drain D1, the photosensitive gate region 34B and the source S1 in combination constitute a first lateral MOSSIT; the source S1, the photosensitive gate region 34C and the drain D2 constituting in combination a second lateral MOSSIT; and the drain D2, the photosensitive gate region 34D and the source S2 likewise constituting a third lateral MOSSIT.

As described above, the source S1 formed by the source/drain diffused layer 37B constitutes a common source of the first and second lateral MOSSITs. Specifically, the source S1 serves as a common source of the two photosensitive gate regions 34B and 34C. The drain D2 formed by the source/drain diffused layer 37C constitutes a common drain of the second and third lateral MOSSITs. Specifically, the drain D2 serves as a common drain of the two photosensitive gate regions 34C and 34D. Similarly, the drain D1 formed by the source/drain diffused layer 37A serves as a common drain of the two photosensitive gate regions 34A and 34B, and the source S2 formed by the source/drain diffused layer 37D serves as a common source of the two photosensitive gate regions 34D and 34E.

Accordingly, since the respective lateral MOSSITs are constituted by a combination of the source/drain diffused layers 37A to 37D and their adjacent source/drain diffused layers, picture-element cells 41, 42, 43 and 44 defined by one-dot chain lines in FIG. 3 may be regarded as equivalent unit picture elements of the imaging part 31. The semiconductor imaging device of the present invention includes the unit picture elements constituted by such picture-element cells which are arranged in the form of a matrix so as to serve as the imaging part.

Figure 4:
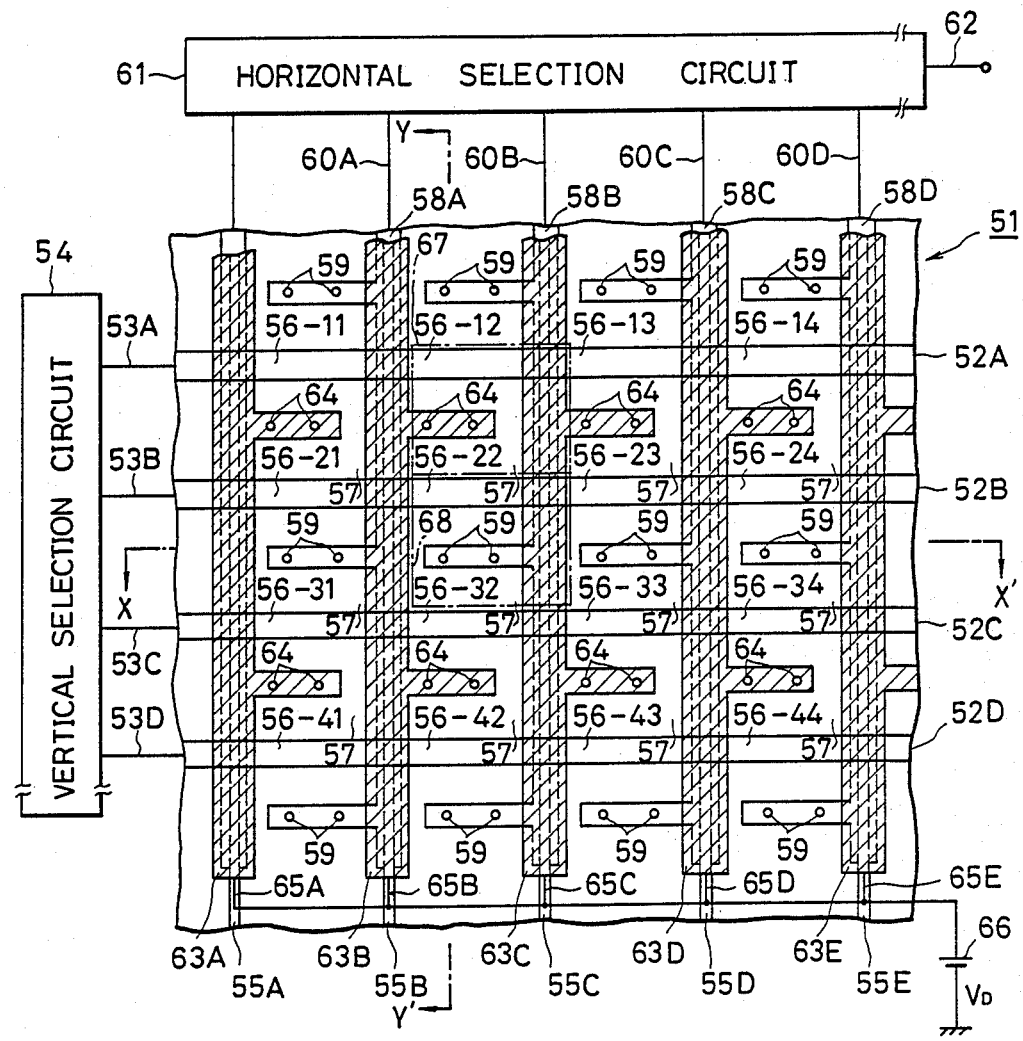
FIG. 4 is a schematic, top plan view of one preferred embodiment of the semiconductor imaging device in accordance with the present invention.

FIG. 4 is a top plan view showing an embodiment of the semiconductor imaging device in which the lateral MOSSIT photosensitive elements of the invention are arranged in the form of a matrix and which is suitably used as various types of picture device.

In FIG. 4, the embodiment of the semiconductor imaging device includes an imaging part indicated generally at 51, and gate lines 52A, 52B, 52C, 52D, ... are formed in lines by polysilicon or the like on the imaging part 51. The respective gate lines 52A, 52B, 52C, 52D, ... are connected to a vertical selection circuit 54 via gate wires 53A, 53B, 53C, 53D, ..., respectively. Isolating layers 55A, 55B, 55C, 55D, 55E, ... are formed in columns on the imaging part 51. In the same manner as in the case of the previously described prior art, the isolating layers 55A, 55B, 55C, 55D, 55E, ... are formed by providing trenches in a semiconductor by a trench forming method and charging an insulating substance such as SiO₂ in the trench. Photosensitive gate regions 56-11, 56-12, ..., 56-21, 56-22, ..., 56-31, 56-32, ... and 56-41, 56-42, ... are formed under the gate lines 52A, 52B, and are separated by the respective isolating layers 55A, 55B, ... .

After the isolating layers 55A, 55B, ... have been formed, the gate lines 52A, 52B, ... are formed. Subsequently, source/drain diffused layers 57 are formed by ion implantation. Source lines 58A, 58B, 58C, 58D, ... are formed in columns on the imaging part 51. The source lines 58A, 58B, 58C, 58D, ..., respectively, have projection electrodes for forming contact with the sources of the source/drain diffused layers 57. Contact holes 59 are formed under each of the projection electrodes, and contacts are formed by using Al or the like through the contact holes 59. In addition, the source lines 58A, 58B, 58C, 58D, ..., respectively, are connected to a horizontal selection circuit 61 via source wires 60A, 60B, 60C, 60D, ... . An output signal line 62 is disposed so as to sequentially output signals which are read out of the respective photosensitive gate regions 56-11, 56-12, ... .

Drain lines 63A, 63B, 63C, 63D, 63E, ... are formed in columns in the same manner as the aforesaid source lines 58A, 58B, 58C, 58D, ..., respectively. The drain lines 63A, 63B, 63C, 63D, ..., respectively, have projection electrodes for forming contact with the drains of the source/drain diffused layers 57. Contact holes 64 are formed under each of the projection electrodes, and contacts are formed by using Al or the like through the contact holes 59. In addition, the drain lines 63A, 63B, ..., respectively, are connected in common to a drain voltage supply 66 via drain wires 65A, 65B, in such a manner that a voltage ($V_D$) is normally applied to the drain lines 63A, 63B, ... .

It is to be noted that the gate lines 52A, 52B, ..., the source lines 58A, 58B, ..., and the drain lines 63A, 63B, ... are electrically separated from one another by insulating layers.

In the above-described arrangement, for example, a source S formed by a portion of the source/drain diffused layer 57 serves as a common source of the two photosensitive gate regions 56-23 and 56-33, and a drain D formed by another portion of the source/drain diffused layer 57 serves as a common drain of the two photosensitive gate regions 56-33 and 56-43. Accordingly, as previously mentioned in the description of the basic construction shown in FIG. 3, picture-element cells 67 and 68 defined by one-dot chain lines as shown in FIG. 4, for example, constitute unit picture elements which are equivalent to and adjacent to each other.

Figure 5A:
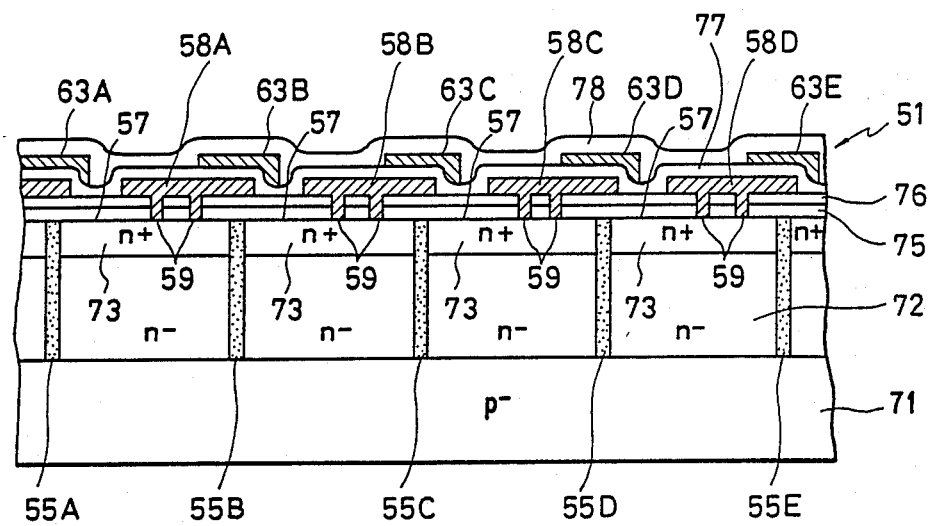
FIGS. 5A and 5B are respectively sectional views taken along the lines X - X' and Y - Y' of FIG. 4.
Figure 5B:
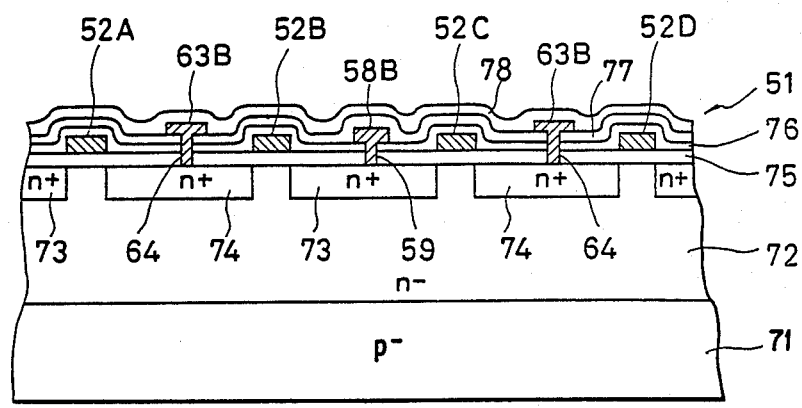

FIGS. 5A and 5B are respectively sectional views of the semiconductor imaging device taken along the line X - X' and Y - Y' of FIG. 4. In FIGS. 5A and 5B, like reference numerals are used to denote like or corresponding elements relative to those mentioned in the description of the aforesaid embodiment shown in FIG. 4, and its description is omitted.

Figure 7A:
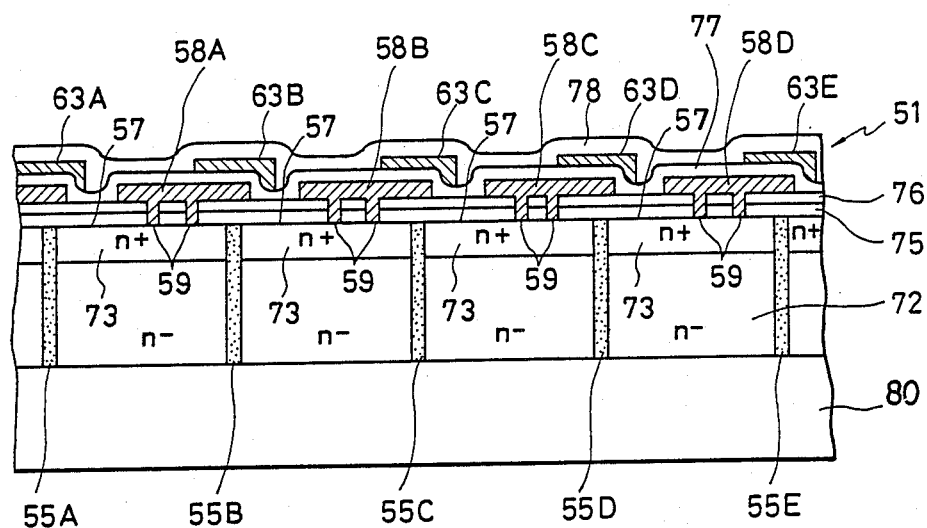
FIG. 7 is identical to FIG. 5A except that it shows an insulating substrate 80 instead of a $p^-$type substrate 71.
FIG. 7B is identical to FIG. 5B except that it shows an insulating substrate 80 instead of a $p^-$-type substrate 71.
Figure 7B:
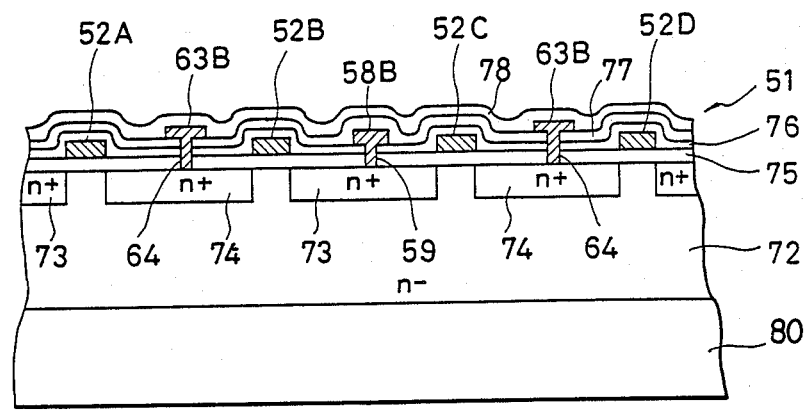

The structure, parameters and the like of the device including lateral MOSSIT photosensitive elements constituted by n-channel MOSSITs will be described below with reference to FIGS. 5A and 5B. In these FIGS., a p⁻-type ,100. substrate is indicated at 71, and the concentration of the substrate 71 is in the range of about $10^{12}$ to $10^{15}$ cm⁻³. An n⁻-type epitaxial layer 72 is grown on the substrate 71 by an epitaxial method or the like, and forms an n⁻-type channel region. The n⁻-type epitaxial layer 72 has a thickness of about 5 to 10 μm and a concentration of about $1\times10^{13}$ to $5\times10^{13}$ cm⁻³. Insulating substrate 80 is shown in FIGS. 7A and 7B.

The shallow n+source/drain regions 57 which will constitute source or drain regions are formed in the surface of the n⁻-type epitaxial layer 72. N+-type source regions 73 and n+-type drain region 74 are formed by using the source/drain regions 57. In this case, the n+-type source regions 73 and the n+-type drain regions 74 are formed in a self-aligned manner with respect to the gate lines 52A, 52B, The depth of diffusion in the n+-type source regions 73 and the n+-type drain regions 74 is equal to or less than about 0.5 μm. A gate insulating film 75 is formed on the surface of the n⁻-type epitaxial layer 72, and has a thickness of about 200 to 1000 Å. The n+-type source regions 73 and the n+-type drain regions 74 are formed in a self-aligned manner with respect to the gate lines 52A, 52B, each having a gate electrode formed on the gate insulating film 75. An interlayer insulating film 76 is formed on the gate insulating film 75, an insulating film 77 being formed on the interlayer insulating film 76, and a protective film 78 being formed on the insulating film 77.

In the above-described arrangement of the presently preferred embodiment, since two adjacent SIT cells share their sources and drains with each other, it is possible to reduce the area of each unit picture element to about half of that of the previously-described prior-art example. In the lateral MOSSIT, since the source or drain diffused layers serve as electrical isolation with respect to the signal storage gate portion of each of the picture elements, it is unnecessary to form any isolating layer in lines, i.e. laterally by a trench forming method or the like as shown in the aforesaid embodiment. This contributes to a reduction in the area of each unit picture element. The picture-element cells 67, 68 and the like of the aforesaid embodiment can be reduced to a size equivalent to or less than about 5 $\mu m \times 5$ $\mu m$ by existing manufacturing techniques. Therefore, it is possible to easily reduce the area of each unit picture element.

The operation of the semiconductor imaging device of the invention will be described below with reference to the signal-waveform charts shown in FIGS. 6A to 6I and the aforesaid embodiment. FIGS. 6A to 6D are respectively charts of the waveforms of readout signals $V_{G1}$, $V_{G2}$, $V_{G3}$ and $V_{G4}$ which are respectively applied from the vertical selection circuit 54 to the gate lines 52A, 52B, 52C and 52D. FIGS. 6E to 6H are respectively charts of the waveforms of signal selecting pulses $\phi_{R1}$, $\phi_{R2}$, $\phi_{R3}$ and $\phi_{R4}$ which are applied by the horizontal selection circuit 61 so as to select the source lines 58A, 58B, 58C and 58D, respectively. FIG. 6I shows an example of amplified photoelectric signals generated by the picture-element cells and outputted to a signal output line 62 of the horizontal selection circuit 61.

Referring to FIGS. 6A to 6I, a signal storage voltage $V_{ST}$ is applied to the gate line 52A before the time $t_1$. When the vertical selection circuit 54 applies a signal readout voltage $V_{RD}$ to the gate line 52A at a time $t_1$, a readout is performed with respect to the picture-element cells which are arrayed in one line along the gate line 52A. Subsequently, when the source line 58A is selected by the application of the signal selecting pulse $\phi_{R1}$ from the horizontal selection circuit 61, the amplified photoelectric signal developed at the photosensitive gate region 56-11 is outputted to the signal output line 62.

Subsequently, since the source lines 58B, 58C, ... are sequentially selected by the application of the signal selecting pulses $\phi_{R2}$, $\phi_{R3}$, ..., the amplified photosensitive signals developed at the photosensitive gate regions 56-12, 56-13, ... are sequentially read out and supplied to the signal output line 62. After the signal readout with respect to a final source line (not shown) has been completed, a reset voltage $V_R$ is applied to the gate line 52A, and thus the resetting of the signal readout with respect to the picture elements arrayed in this line is completed. Subsequently, the signal storage voltage $V_{ST}$ is applied to the gate line 52A.

Moreover, in order to read signals from the picture elements arrayed in the succeeding line, the signal readout voltage $V_{RD}$ is applied to the gate line 52B, and the same operation as described above is repeated. Thus, the amplified photoelectric signals are sequentially read from the photosensitive gate regions 56-21, 56-22, ... . Similarly, all photoelectric signals are read from the remaining photosensitive gate regions, so that signals corresponding to one frame is obtained.

The above-described semiconductor imaging device of the invention is not confined solely to the aforesaid embodiment, and the various structural and operational features disclosed may be changed and modified in a number of ways. Although the aforesaid embodiment uses a substrate made of a $p^-$-type semiconductor, it is important to employ a substrate in which no substantial path of electric current is formed. Therefore, it is also possible to use an insulator as well as an intrinsic semiconductor. In particular, if the substrate is constituted by a $p^-$-type semiconductor of the conductivity type opposite to that of the epitaxial layer which forms the channel regions, it is possible to apply a bias voltage to the channel regions from the substrate (back-gate bias). This arrangement enables the control current within each of the channel regions to be controlled from the gate on the device surface and the substrate. Therefore, even in the case of devices having the same structure, their photoelectric conversion characteristics can be varied through the intermediary of their substrate bias. Accordingly, desired photoelectric conversion characteristics can be freely established by suitably selecting the level of the substrate bias.

Although the channel regions of the aforesaid embodiment are of the n-channel type in which electrons flow in the channel regions as signal electric charge, the channels may be of the p-channel type. In this case, however, it is preferable to inverse the conductivity types of the respective regions so as to reverse the polarity of the bias voltage to be applied.

A semiconductor material may be selected from the group consisting of simple elements belonging to the groups IV and V in the periodic table, the group consisting of bulk crystals such as compound semiconductors belonging to the groups II–V and II–VI and the group consisting of their amorphous substances.

As described above, since the semiconductor imaging device of the present invention is constituted using the lateral MOSSITs each having a MIS gate structure, the inventive device can be provided with not only the function of photoelectric conversion but also the function of amplification. Accordingly, the S/N ratio can be made greater than that of a conventional type of device employing such elements as a MOS transistor and a CCD which has no function of amplification.

Since the SITs used in the semiconductor imaging device of the invention are so designed as to operate in an unsaturated mode, they possess various advantages such as high-speed operation, low noise, low power consumption and high input impedance. Accordingly, it is possible to obtain semiconductor imaging devices having superior photoelectric conversion characteristics such as high sensitivity, high-speed response and a wide dynamic range.

In addition, in accordance with the present invention, the intervals between the respective picture elements which are disposed adjacent to each other in the vertical or lateral direction can be substantially reduced to about half of those between the picture elements used in prior-art lateral MOSSITs. This enhances the density of picture element formation.

Moreover, in accordance with the present invention, since the source region and the drain region can be formed in a self-aligned manner with respect to each of the gate electrodes, it is possible to extremely reduce variations in the electrical characteristics of the picture elements formed on each chip or wafer. Furthermore, utilization of the non-destructive readout function would provide advantage favorable for the achievement of multifunction devices, intelligent devices and the like.

As described above in detail, the semiconductor imaging device of the invention is favorable for the accomplishment of high resolution, a high degree of integration and superior uniformity, and is suitable for a three-dimensionally laminated device as well.

What is claimed is:

1. A semiconductor imaging device including lateral MOS static induction transistors including:
   a semiconductor layer formed on an insulating substrate or a high-resistance semiconductor substrate; and
   picture elements arranged in the form of a matrix over the surface of said semiconductor layer, said picture elements respectively constituted by lateral MOS static induction transistors each having a source region and a drain region both of which serve as main electrodes and a gate region for storing therein a photoelectric signal, wherein the improvement comprises isolating regions formed between said respective picture elements in one direction only on said matrix so that the respective adjacent ones of said picture elements share a source region with each other and a drain region with each other, in said one direction.

2. A semiconductor imaging device according to claim 1, wherein each of said gate regions consititutes in combination with the adjacent source or drain region an equivalent unit picture element.

3. A semiconductor imaging device according to claim 1, wherein said source regions and said drain regions are disposed alternately.

4. A semiconductor imaging device according to claim 1, wherein each of said picture elements shares its source region with one of two picture elements adjacent thereto and also shares its drain with the other of said two picture elements.

* * * * *